United States Patent
Iwayama et al.

(10) Patent No.: US 12,133,394 B2
(45) Date of Patent: Oct. 29, 2024

(54) MAGNETIC MEMORY DEVICE

(71) Applicant: Kioxia Corporation, Tokyo (JP)

(72) Inventors: Masayoshi Iwayama, Seoul (KR); Tatsuya Kishi, Seongnam-si (KR); Masahiko Nakayama, Kanagawa (JP); Toshihiko Nagase, Tokyo (JP); Daisuke Watanabe, Mie (JP); Tadashi Kai, Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/229,133

(22) Filed: Aug. 1, 2023

(65) Prior Publication Data

US 2023/0380183 A1 Nov. 23, 2023

Related U.S. Application Data (62) Division of application No. 17/371,138, filed on Jul. 9, 2021, now Pat. No. 11,758,739, which is a division of application No. 16/353,069, filed on Mar. 14, 2019, now Pat. No. 11,094,743.

(30) Foreign Application Priority Data

Sep. 18, 2018 (JP) .................. 2018-173557

(51) Int. Cl.
| | |
|---|---|
| *H01L 29/82* | (2006.01) |
| *H10B 61/00* | (2023.01) |
| *H10N 50/01* | (2023.01) |
| *H10N 50/80* | (2023.01) |
| *H10N 50/85* | (2023.01) |

(52) U.S. Cl.
CPC ............ *H10B 61/10* (2023.02); *H10N 50/01* (2023.02); *H10N 50/80* (2023.02); *H10N 50/85* (2023.02)

(58) Field of Classification Search
CPC ........ H10B 61/10; H10B 61/22; H10N 50/01; H10N 50/80; H10N 50/85; H10N 50/10; G11C 11/161
USPC ........................................................ 257/427
See application file for complete search history.

(56) References Cited

U.S. PATENT DOCUMENTS

| | | |
|---|---|---|
| 6,169,689 B1 | 1/2001 | Naji |
| 6,795,334 B2 | 9/2004 | Iwata et al. |
| 6,882,553 B2 | 4/2005 | Nejad et al. |

(Continued)

FOREIGN PATENT DOCUMENTS

| | | |
|---|---|---|
| JP | 2007036272 A | 2/2007 |
| JP | 4403356 B2 | 1/2010 |

*Primary Examiner* — Tan N Tran
(74) *Attorney, Agent, or Firm* — Holtz, Holtz & Volek PC (57) ABSTRACT

A magnetic memory device including a first memory cell which includes a first stacked structure including a magnetic layer and a second memory cell which is provided on the first memory cell and includes a second stacked structure including a magnetic layer. Each of the first stacked structure and the second stacked structure includes a first magnetic layer having a variable magnetization direction, a second magnetic layer having a fixed magnetization direction, and a nonmagnetic layer provided between the first magnetic layer and the second magnetic layer. A concentration of iron (Fe) contained in the first magnetic layer included in the first stacked structure and a concentration of iron (Fe) contained in the first magnetic layer included in the second stacked structure are different from each other.

10 Claims, 5 Drawing Sheets

(56) References Cited

U.S. PATENT DOCUMENTS

| | | |
|---|---|---|
| 7,061,036 B2 | 6/2006 | Kajiyama |
| 7,405,085 B2 | 7/2008 | Kools et al. |
| 7,791,845 B2 | 9/2010 | Mauri et al. |
| 8,184,410 B2 * | 5/2012 | Fuji .................. G11B 5/398 |
| | | 365/158 |
| 8,259,485 B2 | 9/2012 | Yang et al. |
| 8,576,616 B2 * | 11/2013 | Saida .................. G11C 11/1655 |
| | | 365/158 |
| 9,048,412 B2 | 6/2015 | Oh et al. |
| 9,349,941 B2 | 5/2016 | Ranjan et al. |
| 10,497,751 B2 * | 12/2019 | Sim .................. H10N 70/8413 |
| 2006/0267056 A1 | 11/2006 | Ju et al. |
| 2013/0015539 A1 | 1/2013 | Choi |
| 2013/0044538 A1 | 2/2013 | Oh et al. |

\* cited by examiner

|  | Before annealing | After annealing |
|---|---|---|
| Fourth layer | 3.9kOe | 4.0kOe |
|  | 19.5μA | 20μA |
| Third layer | 3.8kOe | 4.0kOe |
|  | 19.0μA | 20μA |
| Second layer | 3.7kOe | 4.0kOe |
|  | 18.5μA | 20μA |
| First layer | 3.6kOe | 4.0kOe |
|  | 18.0μA | 20μA |

MAGNETIC MEMORY DEVICE

CROSS-REFERENCE TO RELATED APPLICATIONS

This application is a Divisional Application of U.S. application Ser. No. 17/371,138, filed on Jul. 9, 2021, which is a Divisional Application of U.S. application Ser. No. 16/353,069, filed Mar. 14, 2019, and issued as U.S. Pat. No. 11,094,743 on Aug. 17, 2021, which is based upon and claims the benefit of priority from Japanese Patent Application No. 2018-173557, filed Sep. 18, 2018, the entire contents of both of which are incorporated herein by reference.

FIELD

Embodiments described herein relate generally to a magnetic memory device

BACKGROUND

A magnetic memory device (semiconductor integrated circuit device) provided with a magnetoresistive element and a switching element for selecting the magnetoresistive element on a semiconductor substrate has been proposed.

In the above-described magnetic memory device, it is also proposed to have memory cells, which are disposed at different height positions in the same direction, including the magnetoresistive element and the switching element in order to increase the degree of integration.

However, it can not be said that optimization of each stacked magnetoresistive element has been sufficiently made in the related art.

DETAILED DESCRIPTION

In general, according to one embodiment, a magnetic memory device includes: a first memory cell which includes a first stacked structure including a magnetic layer; and a second memory cell which is provided on the first memory cell and includes a second stacked structure including a magnetic layer, wherein each of the first stacked structure and the second stacked structure has a structure in which a plurality of layers including a predetermined layer are stacked, and the predetermined layer included in the first stacked structure and the predetermined layer included in the second stacked structure have different thicknesses.

Hereinafter, embodiments will be described with reference to the drawings.

First Embodiment

Figure 1:
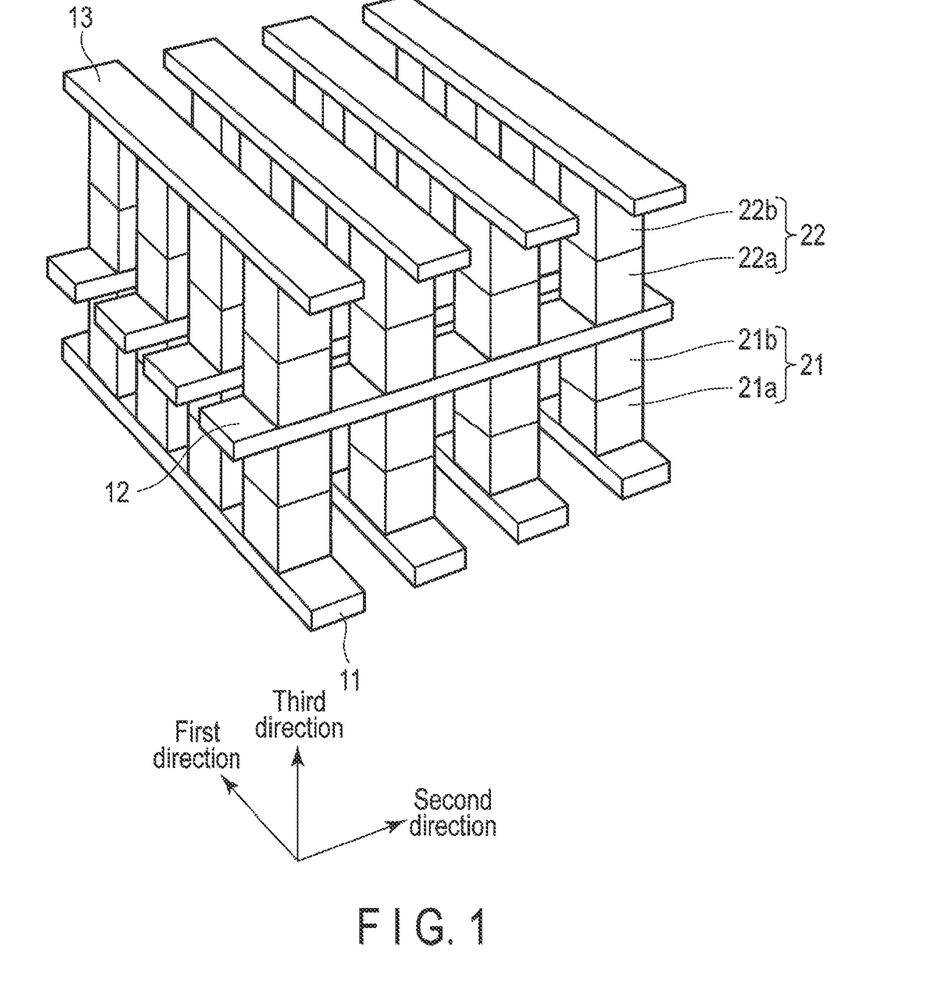
FIG. 1 is a bird's-eye view schematically showing a configuration of a magnetic memory device according to a first embodiment.
Figure 2:
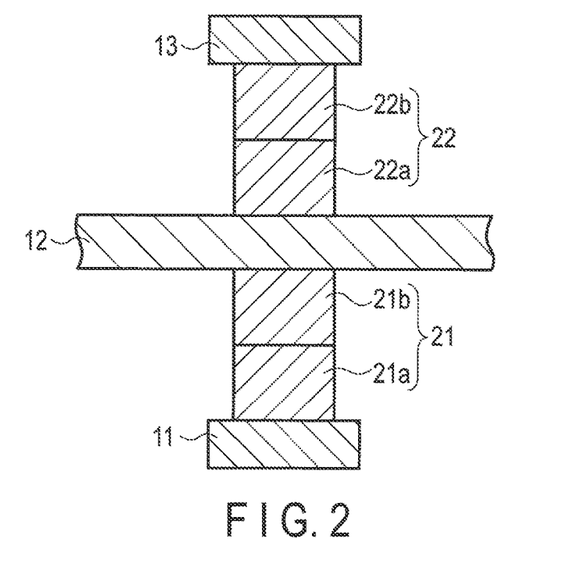
FIG. 2 is a cross-sectional view schematically showing a configuration of the magnetic memory device according to the first embodiment.

FIG. 1 is a bird's-eye view schematically showing a configuration of a magnetic memory device (semiconductor integrated circuit device) according to a first embodiment. FIG. 2 is a cross-sectional view schematically showing the configuration of the magnetic memory device (semiconductor integrated circuit device) according to the first embodiment.

As shown in FIGS. 1 and 2, a first wiring 11, a second wiring 12, a third wiring 13, a first memory cell 21, and a second memory cell 22 are provided on a lower structure (not shown) including a semiconductor substrate (not shown), peripheral circuits (not shown) and the like. Although not shown in FIGS. 1 and 2, an insulating region is provided in a region in which the first wiring 11, the second wiring 12, the third wiring 13, the first memory cell 21, and the second memory cell 22 are not provided.

The second wiring 12 is provided on an upper layer side with respect to the first wiring 11 and the third wiring 13 is provided on an upper layer side with respect to the second wiring 12. The first wiring 11 and the third wiring 13 extend in a first direction, and the second wiring 12 extends in a second direction orthogonal to the first direction. The first memory cell 21 is provided between the first wiring 11 and the second wiring 12, and the second memory cell 22 is provided between the second wiring 12 and the third wiring 13.

The first memory cell 21 includes a first stacked structure 21a including a magnetic layer and a first switching element 21b connected to the first stacked structure 21a in series (a third direction). Similarly, the second memory cell 22 includes a second stacked structure 22a including a magnetic layer and a second switching element 22b connected to the second stacked structure 22a in series (the third direction). In FIGS. 1 and 2, the first stacked structure 21a is provided on a lower layer side with respect to a first switching element 21b, but the first stacked structure 21a may be provided on an upper layer side with respect to the first switching element 21b. In FIGS. 1 and 2, the second stacked structure 22a is provided on a lower layer side with respect to a second switching element 22b, but the second stacked structure 22a may be provided on an upper layer side with respect to the second switching element 22b.

In the first embodiment, a structure in which two memory cells of the first memory cell 21 and the second memory cell 22 are stacked is adopted, but a structure in which three or more memory cells are stacked may be adopted.

Figure 3:
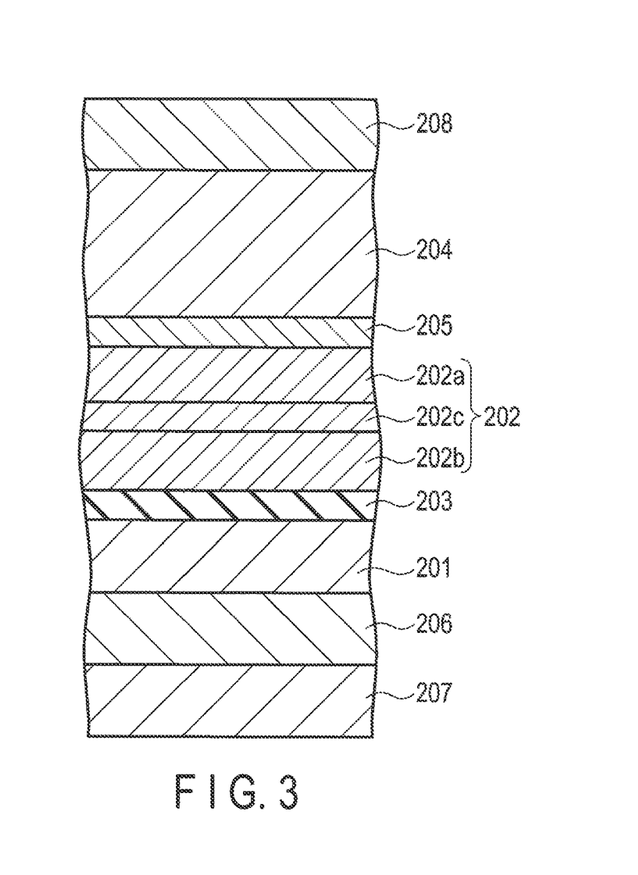
FIG. 3 is a cross-sectional view schematically showing a basic configuration of a stacked structure according to the first embodiment.

FIG. 3 is a cross-sectional view schematically showing a basic configuration of the first stacked structure 21a and the second stacked structure 22a.

Both the first stacked structure 21a and the second stacked structure 22a serve as a spin transfer torque (STT) type magnetoresistive element having perpendicular magnetization, and include a first magnetic layer 201, a second magnetic layer 202, a nonmagnetic layer 203, a third magnetic layer 204, an intermediate layer 205, an under layer 206, a buffer layer 207, and a cap layer 208.

The first magnetic layer 201 has a variable magnetization direction and serves as a storage layer of a magnetoresistive element. The fact that the magnetization direction is variable means that the magnetization direction changes with respect to a predetermined write current. The first magnetic layer 201 is formed of a magnetic material having characteristics of the perpendicular magnetization. For example, the first magnetic layer 201 contains at least iron (Fe) or cobalt (Co). The first magnetic layer 201 may contain boron (B) in addition to iron (Fe) or cobalt (Co).

The second magnetic layer 202 is formed of a magnetic material having the characteristics of the perpendicular magnetization, has a fixed magnetization direction, and serves as a reference layer of the magnetoresistive element. The fact that the magnetization direction is fixed indicates that the magnetization direction does not change with respect to the predetermined write current. The second magnetic layer 202 includes a first sub-magnetic layer 202a, a second sub-magnetic layer 202b, and an intermediate layer 202c. The first sub-magnetic layer 202a contains cobalt (Co) and at least one element selected from platinum (Pt), nickel (Ni), and palladium (Pd). The second sub-magnetic layer 202b contains at least iron (Fe) or cobalt (Co). The second magnetic layer 202b may contain boron (B) in addition to iron (Fe) or cobalt (Co). The intermediate layer 202c is formed of tantalum (Ta), zirconium (Zr), tungsten (W), hafnium (Hf), molybdenum (Mo), niobium (Nb), titanium (Ti), vanadium (V), or chromium (Cr).

The nonmagnetic layer 213 is interposed between the first magnetic layer 201 and the second magnetic layer 202 and serves as a tunnel barrier layer of the magnetoresistive element. The nonmagnetic layer 213 contains magnesium (Mg) and oxygen (O).

The third magnetic layer 204 has a fixed magnetization direction in antiparallel to the magnetization direction of the second magnetic layer 202. The third magnetic layer is for canceling a magnetic field applied from the second magnetic layer 202 to the first magnetic layer 201 and serves as a shift canceling layer of the magnetoresistive element. The third magnetic layer contains cobalt (Co) and at least one element selected from platinum (Pt), nickel (Ni), and palladium (Pd).

The intermediate layer 205 is interposed between the second magnetic layer 202 and the third magnetic layer 204, and is formed of ruthenium (Ru), iridium (Ir) or the like.

The under layer 206 is provided beneath the first magnetic layer 201. The under layer 206 is formed of magnesium oxide, magnesium nitride, zirconium nitride, niobium nitride, silicon nitride, aluminum nitride, hafnium nitride, tantalum nitride, tungsten nitride, chromium nitride, molybdenum nitride, titanium nitride, vanadium nitride, and the like. In addition, the under layer 206 is not necessarily formed of a binary compound including two kinds of elements, and may be formed of a ternary compound (for example, titanium aluminum nitride and the like).

The buffer layer 207 is provided beneath the under layer 206. The buffer layer 207 contains Al, Be, Mg, Ca, Sr, Ba, Sc, Y, La, Si, Zr, Hf, W, Cr, Mo, Nb, Ti, Ta, V, and the like. Alternatively, the buffer layer 207 may also be a boride of these elements. For example, HfB, MgAlB, HfAlB, ScAlB, ScHfB, HfMgB, or the like may be used.

The cap layer 208 is provided on the third magnetic layer (shift canceling layer) 204. The cap layer 208 is formed of platinum, tungsten, tantalum, ruthenium, and the like.

It is to be noted that a first sub-stacked portion is constituted by the first magnetic layer 201, the second magnetic layer 202, the nonmagnetic layer 203, the third magnetic layer 204, the intermediate layer 205, and the cap layer 208 which are described above, and a second sub-stacked portion is constituted by the under layer 206 and the buffer layer 207.

In addition, in the example shown in FIG. 3, a stacking order of the first magnetic layer 201, the second magnetic layer 202, and the nonmagnetic layer 203 is the order of the first magnetic layer 201, the nonmagnetic layer 203, and the second magnetic layer 202 from the lower layer side. On the contrary, however, the stacking order of the first magnetic layer 201, the second magnetic layer 202, and the nonmagnetic layer 203 may be the order of the second magnetic layer 202, the nonmagnetic layer 203, and the first magnetic layer 201.

The first switching element 21b shown in FIGS. 1 and 2 is used for selecting the first stacked structure 21a, and the second switching element 22b is used for selecting the second stacked structure 22a. Both the first switching element 21b and the second switching element 22b serve as a two-terminal switching element. When a voltage applied between the two terminals is lower than a threshold voltage, a two-terminal switching element is in a high resistance state (for example, in an electrically non-conducting state). When the voltage applied between the two terminals is larger than the threshold voltage, the two-terminal switching element is in a low resistance state (for example, in an electrically conducting state). The two-terminal switching element may have the above-described function in both directions.

As one example, the above-described switching element may contain at least one chalcogen element selected from the group consisting of Te, Se, and S. Alternatively, the switching element may contain chalcogenide which is a compound containing these chalcogen elements. In addition, for example, the above-described switching element may contain at least one element selected from the group consisting of B, Al, Ga, In, C, Si, Ge, Sn, As, P, and Sb.

In the manufacturing of the magnetic memory device having the configuration as described above, the first memory cell 21 on the lower layer side is subjected to heat treatment more than the second memory cell 22 on the upper layer side. That is, the first stacked structure 21a is subjected to heat treatment more than the second stacked structure 22a. Therefore, the characteristics of the first memory cell 21 (first stacked structure 21a) deteriorate, or characteristic differences may occur between the first memory cell 21 (first stacked structure 21a) and the second memory cell 22 (second stacked structure 22a). When such characteristics deteriorate or characteristic differences occur, it becomes difficult to obtain a magnetic memory device having desired performance.

In the first embodiment, in order to reduce the above-described problem, the following configuration example is proposed.

First, the first configuration example will be described.

In the first configuration example, the thickness of the first magnetic layer (storage layer) 201 included in the second stacked structure 22a is smaller than that of the first magnetic layer (storage layer) 201 included in the first stacked structure 21a. When a plurality of memory cells are disposed at different height positions in the third direction, the thickness of the storage layer included in the memory cell on the upper layer side is preferably smaller than that of the storage layer included in the memory cell on the lower layer side. That is, assuming that the thickness of the storage layer included in the memory cell of the nth layer is Tn and the thickness of the storage layer included in the memory cell of the (n+1)th layer is Tn+1, it is preferable that Tn>Tn+1. However, for all the storage layers, the relationship of Tn>Tn+1 may not be satisfied, and there may be a portion satisfying the relationship of Tn=Tn+1.

Figure 4:
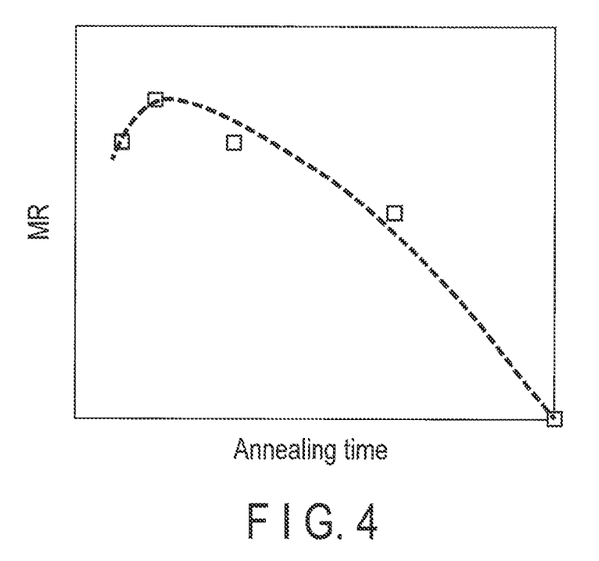
FIG. 4 is a diagram showing the relationship between an annealing time of a magnetoresistive element and MR of the magnetoresistive element according to the first embodiment.

FIG. 4 is a diagram showing the relationship between the annealing time of the magnetoresistive element and the MR of the magnetoresistive element. As shown in FIG. 4, as the annealing time is increased, the MR is decreased. As described above, when the plurality of memory cells are stacked, as compared with the memory cell on the upper layer side, as the memory cell is disposed on the lower layer side, a total heat treatment time (annealing time) becomes longer. As a result, as can be seen from FIG. 4, when the plurality of memory cells are disposed at different height positions in the third direction, as the magnetoresistive element is disposed on the lower layer side, the MR is decreased.

Figure 5:
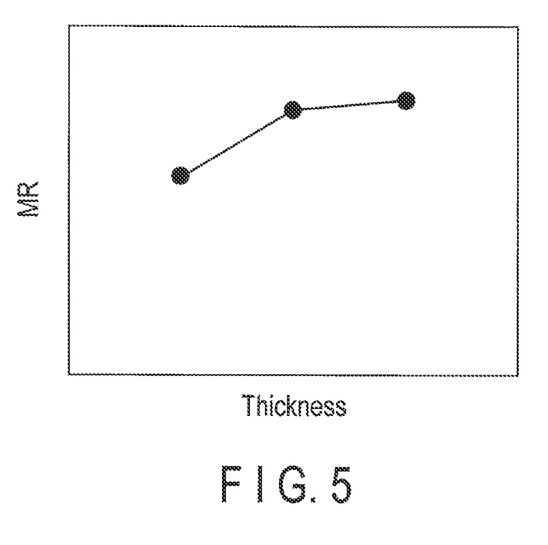
FIG. 5 is a diagram showing the relationship between a thickness of a storage layer and the MR of the magnetoresistive element according to the first embodiment.

FIG. 5 is a diagram showing the relationship between the thickness of the storage layer and the MR of the magnetoresistive element. As shown in FIG. 5, as the thickness of the storage layer is increased, the MR is also increased.

It is understood from FIGS. 4 and 5 that by making the thickness of the storage layer on the upper layer side smaller than that of the storage layer on the lower layer side, the MR of the magnetoresistive element on the lower layer side and MR of the magnetoresistive element on the upper layer side become uniform.

Figure 6:
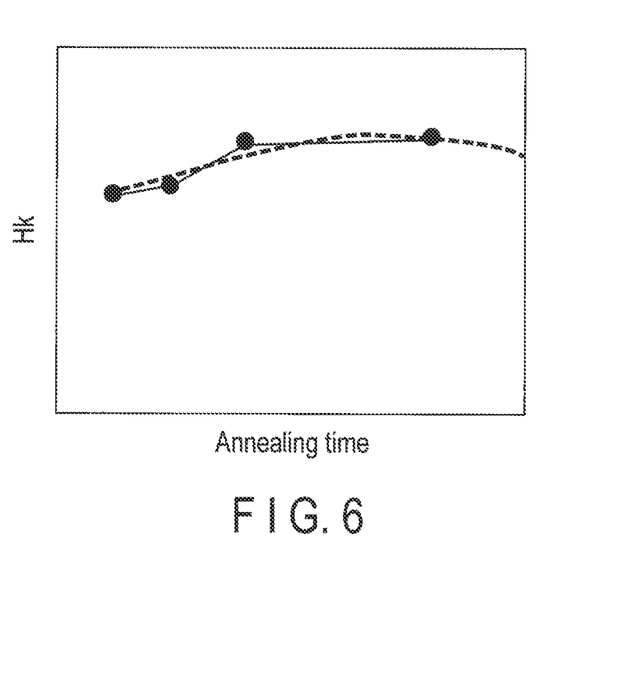
FIG. 6 is a diagram showing the relationship between the annealing time of the magnetoresistive element and Hk of the magnetoresistive element according to the first embodiment.

FIG. 6 is a diagram showing the relationship between the annealing time of the magnetoresistive element and the anisotropic magnetic field (Hk) of the magnetoresistive element. As shown in FIG. 6, as the annealing time is increased, the Hk is also increased. As described above, when the plurality of memory cells are stacked, as compared with the memory cell on the upper layer side, as the memory cell is disposed on the lower layer side, the total heat treatment time (annealing time) becomes longer. As a result, as can be seen from FIG. 6, when the plurality of memory cells are stacked, as the magnetoresistive element is disposed on the lower layer side, the Hk is increased.

Figure 7:
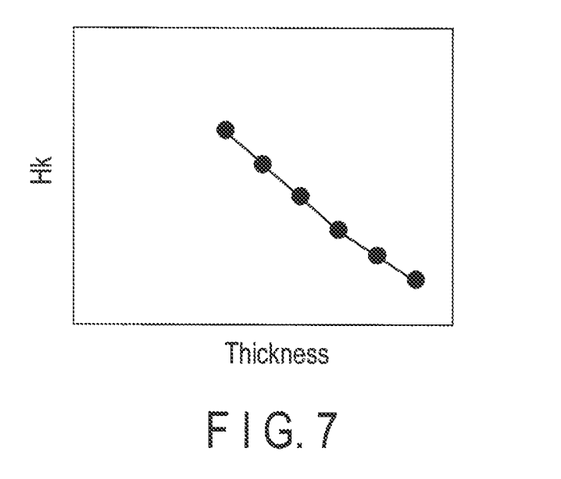
FIG. 7 is a diagram showing the relationship between the thickness of the storage layer and the Hk of the magnetoresistive element according to the first embodiment.

FIG. 7 is a diagram showing the relationship between the thickness of the storage layer and the Hk of the magnetoresistive element. As shown in FIG. 7, as the thickness of the storage layer is increased, the Hk is decreased.

It is understood from FIGS. 6 and 7 that by making the thickness of the storage layer on the upper layer side smaller than that of the storage layer on the lower layer side, the Hk of the magnetoresistive element on the lower layer side and Hk of the magnetoresistive element on the upper layer side become uniform.

In general, as the annealing time is increased, a coercive force (Hc) is also increased. As a result, when the plurality of memory cells are stacked, as the magnetoresistive element is disposed on the lower layer side, the Hc is increased. Meanwhile, as the thickness of the storage layer is increased, the Hc is decreased. Therefore, by making the thickness of the storage layer on the upper layer side smaller than that of the storage layer on the lower layer side, the Hc of the magnetoresistive element on the lower layer side and the Hc of the magnetoresistive element on the upper layer side can be uniform.

Figure 8:
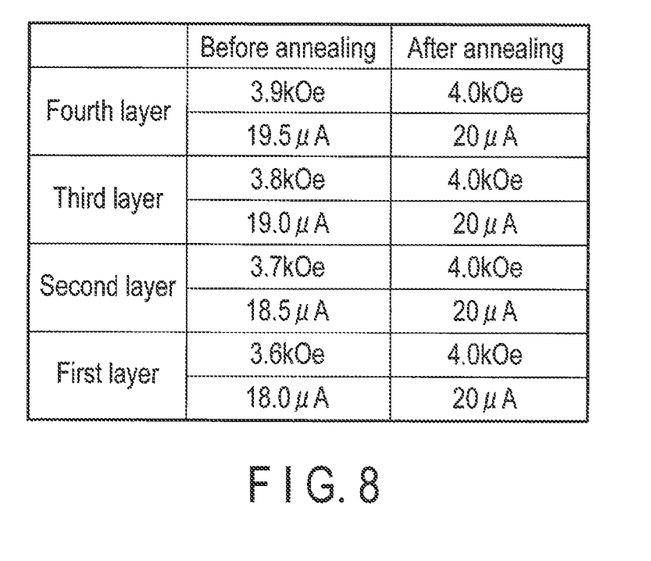
FIG. 8 is a diagram showing characteristics before and after annealing at the time of having four layers of memory cells according to the first embodiment.

FIG. 8 is a diagram showing characteristics before and after the annealing at the time of having four layers of memory cells. An upper stage of each layer is a value of Hk of the magnetoresistive element and a lower stage of each layer is a value of a write current of the magnetoresistive element. With regard to the thickness of the storage layer, a first layer is 2.40 nm, a second layer is 2.35 nm, a third layer is 2.30 nm, and a fourth layer is 2.25 nm. As shown in FIG. 8, the Hk and the write current are uniform after the annealing by adjusting the thickness of the storage layer of each layer.

Next, a second configuration example will be described.

In the second configuration example, the thickness of the under layer 206 included in the second stacked structure 22a is larger than that of the under layer 206 included in the first stacked structure 21a. When the plurality of memory cells are disposed at different height positions in the third direction, the thickness of the under layer included in the memory cell on the upper layer side is preferably larger than that of the under layer included in the memory cell on the lower layer side. That is, assuming that the thickness of the under layer included in the memory cell of the nth layer is Tn and the thickness of the under layer included in the memory cell of the (n+1)th layer is Tn+1, it is preferable that Tn<Tn+1. However, for all the under layers, the relationship of Tn<Tn+1 may not be satisfied, and there may be a portion satisfying the relationship of Tn=Tn+1.

As described above, as the annealing time is increased, the coercive force (Hc) is also increased. As a result, when the plurality of memory cells are disposed at different height positions in the third direction, as the magnetoresistive element is disposed on the lower layer side, the Hc is increased. Meanwhile, as the thickness of the under layer is decreased, the Hc is also decreased. Therefore, by making the thickness of the under layer on the upper layer side larger than that of the under layer on the lower layer side, the Hc of the magnetoresistive element on the lower layer side and the Hc of the magnetoresistive element on the upper layer side can be uniform.

For example, when the four layers of memory cells are disposed at different height positions in the third direction, with regard to the thickness of the under layer, a first layer is 0.26 nm, a second layer is 0.28 nm, a third layer is 0.30 nm, a fourth layer is 0.32 nm, so that it is possible to make the Hc after the annealing uniform.

Next, a third configuration example will be described.

In the third configuration example, the thickness of the first sub-magnetic layer 202a included in the second stacked structure 22a is smaller than that of the first sub-magnetic layer 202a included in the first stacked structure 21a. Generally speaking, when the plurality of memory cells are stacked, the thickness of the first sub-magnetic layer included in the memory cell on the upper layer side is preferably smaller than that of the first sub-magnetic layer included in the memory cell on the lower layer side. That is, assuming that the thickness of the first sub-magnetic layer included in the memory cell of the nth layer is Tn and the thickness of the first sub-magnetic layer included in the memory cell of the (n+1)th layer is Tn+1, it is preferable that Tn>Tn+1. However, for all the first sub-magnetic layers, the relationship of Tn>Tn+1 may not be satisfied, and there may be a portion satisfying the relationship of Tn=Tn+1.

As described above, since the MR is decreased as the annealing time is increased, when the plurality of memory cells are disposed at different height positions in the third direction, as the magnetoresistive element is disposed on the lower layer side, the MR is decreased. Meanwhile, as the thickness of the first sub-magnetic layer is increased, the MR is also increased. Therefore, by making the thickness of the first sub-magnetic layer on the upper layer side smaller than that of the first sub-magnetic layer on the lower layer side, the MR of the magnetoresistive element on the lower layer side and the MR of the magnetoresistive element on the upper layer side can be uniform.

Next, a fourth configuration example will be described.

In the fourth configuration example, the thickness of the second sub-magnetic layer 202b included in the second stacked structure 22a is smaller than that of the second sub-magnetic layer 202b included in the first stacked structure 21a. When the plurality of memory cells are disposed at different height positions in the third direction, the thickness of the second sub-magnetic layer included in the memory cell on the upper layer side is preferably larger than that of the second sub-magnetic layer included in the memory cell on the lower layer side. That is, assuming that the thickness of the second sub-magnetic layer included in the memory cell of the nth layer is Tn and the thickness of the second sub-magnetic layer included in the memory cell of the (n+1)th layer is Tn+1, it is preferable that Tn<Tn+1. However, for all the second sub-magnetic layers, the relationship of Tn<Tn+1 may not be satisfied, and there may be a portion satisfying the relationship of Tn=Tn+1.

As described above, since the MR is decreased as the annealing time is increased, when the plurality of memory cells are disposed at different height positions in the third direction, as the magnetoresistive element is disposed on the lower layer side, the MR is decreased. Meanwhile, as the thickness of the second sub-magnetic layer is increased, the MR is decreased. Therefore, by making the thickness of the second sub-magnetic layer on the upper layer side larger than that of the second sub-magnetic layer on the lower layer side, the MR of the magnetoresistive element on the lower layer side and the MR of the magnetoresistive element on the upper layer side can be uniform.

Next, a fifth configuration example will be described.

In the fifth configuration example, the thickness of the third magnetic layer (shift canceling layer) 204 included in the second stacked structure 22a is larger than that of the third magnetic layer (shift canceling layer) 204 included in the first stacked structure 21a. When the plurality of memory cells are disposed at different height positions in the third direction, the thickness of the third magnetic layer included in the memory cell on the upper layer side is preferably larger than that of the third magnetic layer included in the memory cell on the lower layer side. That is, assuming that the thickness of the third magnetic layer included in the memory cell of the nth layer is Tn and the thickness of the third magnetic layer included in the memory cell of the (n+1)th layer is Tn+1, it is preferable that Tn<Tn+1. However, for all the third magnetic layers, the relationship of Tn<Tn+1 may not be satisfied, and there may be a portion satisfying the relationship of Tn=Tn+1.

As described above, since the MR is decreased as the annealing time is increased, when the plurality of memory cells are stacked, as the magnetoresistive element is disposed on the lower layer side, the MR is decreased. Meanwhile, as the thickness of the third magnetic layer is increased, the MR is decreased. Therefore, by making the thickness of the third magnetic layer on the upper layer side larger than that of the third magnetic layer on the lower layer side, the MR of the magnetoresistive element on the lower layer side and the MR of the magnetoresistive element on the upper layer side can be uniform.

It is to be noted that when generalizing the above-described first to fifth configuration examples, these embodiments can be defined as follows. Each of the first stacked structure 21a and the second stacked structure 22a has a structure in which a plurality of layers including a predetermined layer are disposed, and the predetermined layer included in the first stacked structure 21a and the predetermined layer included in the second stacked structure 22a have different thicknesses from each other.

In the first configuration example, the predetermined layer corresponds to the first magnetic layer (storage layer) 201. In the second configuration example, the predetermined layer corresponds to the under layer 206. In the third configuration example, the predetermined layer corresponds to the first sub-magnetic layer 202a. In the fourth configuration example, the predetermined layer corresponds to the second sub-magnetic layer 202b. In the fifth configuration example, the predetermined layer corresponds to the third magnetic layer (shift canceling layer) 204.

Second Embodiment

Next, a second embodiment will be described. Since basic matters are the same as those of the first embodiment, the matters described in the first embodiment are not described.

Figure 9:
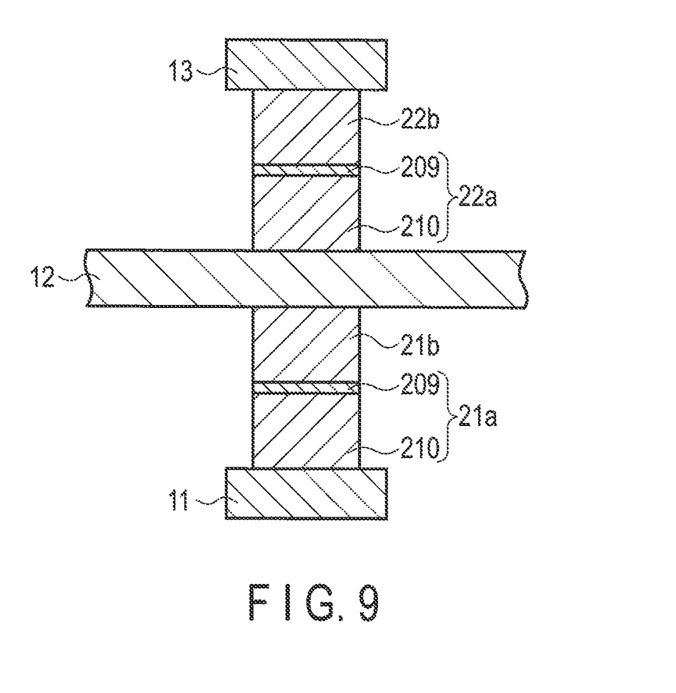
FIG. 9 is a cross-sectional view schematically showing a configuration of a magnetic memory device according to a second embodiment.

FIG. 9 is a cross-sectional view schematically showing the configuration of the magnetic memory device (semiconductor integrated circuit device) according to the second embodiment.

As shown in FIG. 9, in the second embodiment, a first stacked structure 21a and a second stacked structure 22a include a resistance adjustment layer 209 in addition to the stacked structure portion (stacked structure portion 210 in FIG. 9) as shown in FIG. 3. The resistance adjustment layer 209 included in the first stacked structure 21a is provided to adjust the resistance (resistance in the stacking direction) of the first stacked structure 21a, and the resistance adjustment layer 209 included in the second stacked structure 22a is provided to adjust the resistance (resistance in the stacking direction) of the second stacked structure 22a.

As a material of the resistance adjustment layer 209, a metal oxide can be used. For example, as the material of the resistance adjustment layer 209, magnesium oxide (MgO), aluminum oxide (AlO), or the like can be used.

A thickness of the resistance adjustment layer 209 included in the first stacked structure 21a is different from that of the resistance adjustment layer 209 included in the second stacked structure 22a. That is, the thickness of the resistance adjustment layer 209 included in the second stacked structure 22a may be larger or smaller than that of the resistance adjustment layer 209 included in the first stacked structure 21a.

In FIG. 4, as the annealing time is increased, MR is increased until a certain time t, and the MR is decreased after the certain time t. Therefore, when a plurality of memory cells are disposed at different height positions in the third direction, assuming that the thickness of the resistance adjustment layer included in the memory cell of the nth layer is Tn, the thickness of the resistance adjustment layer included in the memory cell of the (n+1)th layer is Tn+1, a thickness of a resistance adjustment layer included in a memory cell on an upper layer side is larger than that of a resistance adjustment layer included in a memory cell on a lower layer side (Tn<Tn+1), the thickness of the resistance adjustment layer included in the memory cell on the upper layer side is smaller than that of the resistance adjustment layer included in the memory cell on the lower layer side (Tn>Tn+1). In addition, until the time t, the thickness of the resistance adjustment layer included in the memory cell on the upper layer side is smaller than that of the resistance adjustment layer included in the memory cell on the lower layer side (Tn>Tn+1), and after the certain time t, the thickness of the resistance adjustment layer included in the memory cell on the upper layer side is larger than that of the resistance adjustment layer included in the memory cell on the lower layer side (Tn<Tn+1). In addition, there may be a portion where Tn=Tn+1.

It is to be noted that the resistance adjustment layer 209 may not be provided in one of the first stacked structure 21a and the second stacked structure 22a. For example, when a plurality of memory cells are disposed at different height positions in the third direction, the resistance adjustment layer 209 may not be provided in a stacked structure of a memory cell of a lowermost layer or a stacked structure of a memory cell of an uppermost layer.

Third Embodiment

Next, a third embodiment will be described. Since basic matters are the same as those of the first embodiment, the matters described in the first embodiment are not described. In addition, a basic configuration of a magnetic memory device is similar to that of FIGS. 1 and 2, and the basic configuration of the stacked structure (first stacked structure 21a and second stacked structure 22a) is the same as that of FIG. 3.

In the third embodiment, a concentration of iron (Fe) contained in a first magnetic layer (storage layer) 201 included in the first stacked structure 21a and a concentration of iron (Fe) contained in the first magnetic layer (storage layer) 201 included in the second stacked structure 22a are different from each other. Specifically, in the third embodiment, the concentration of the iron (Fe) contained in the first magnetic layer 201 included in the second stacked structure 22a may be lower or higher than that of iron (Fe) contained in the first magnetic layer 201 included in the first stacked structure 21a.

In the case in which the concentration of the iron (Fe) is in the range of 90 to 100% or in the range of 50 to 75%, when the plurality of memory cells are disposed at different height positions in the third direction, it is preferable that the concentration of the iron (Fe) contained in the first magnetic layer 201 included in the memory cell on the upper layer side is lower than that of the iron (Fe) contained in the first magnetic layer 201 included in the memory cell on the lower layer side. That is, assuming that the concentration of the iron (Fe) contained in the first magnetic layer 201 included in the memory cell of the nth layer is $C_n$ and the concentration of the iron (Fe) contained in the first magnetic layer 201 included in the memory cell of the (n+1)th layer is $C_{n+1}$, it is preferable that $C_n > C_{n+1}$.

As described above, as the annealing time is increased, a coercive force (Hc) is also increased. Therefore, a write current Ic is also increased. As a result, when the plurality of memory cells are disposed at different height positions in the third direction, as the magnetoresistive element is disposed on the lower layer side, the Hc is increased and the Ic is also increased. Meanwhile, as the concentration of iron (Fe) contained in the first magnetic layer 201 is increased, a damping constant is decreased and the Ic is decreased. Therefore, the concentration of iron (Fe) contained in the first magnetic layer included in the memory cell on the upper layer side is preferably lower than that of the iron (Fe) contained in the first magnetic layer included in the memory cell on the lower layer side.

For example, when the four layers of memory cells are disposed at different height positions in the third direction, with regard to a ratio of the concentration of Fe to the concentration of (Fe+Co), a first layer is 98%, a second layer is 96%, a third layer is 94%, and a fourth layer is 92%, so that it is possible to make the Ic after the annealing uniform. Alternatively, with regard to the ratio of the concentration of Fe to the concentration of (Fe+Co), the first layer is 75%, the second layer is 70%, the third layer is 60%, and the fourth layer is 50%, so that it is possible to make the Ic after the annealing uniform.

When the concentration of iron (Fe) is in the range of 75 to 90%, as the concentration of iron (Fe) is increased, the damping constant is decreased and the Ic is decreased. In this case, for example, when the four layers of memory cells are stacked, with regard to the ratio of the concentration of Fe to the concentration of (Fe+Co), the first layer is 75%, the second layer is 80%, the third layer is 85%, and the fourth layer is 90%, so that it is possible to make the Ic after the annealing uniform.

In each of the above-described embodiments, the case where the two-terminal switching element is applied as a switching element has been described, but as the switching element, a field effect transistor such as a MOS (metal oxide semiconductor) transistor or a FIN type transistor which is a three-terminal switching element may be applied. In addition, as the switching element, an element having a diode function may be applied. For the memory cell array, an arbitrary array structure can be applied. For example, an array structure having a structure which is capable of selecting a memory cell MC by a pair of a bit line BL and a word line WL, and a plurality of the structures are stacked in a Z-direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
   a first memory cell which includes a first stacked structure; and
   a second memory cell which is provided on the first memory cell and includes a second stacked structure, wherein:
   each of the first stacked structure and the second stacked structure includes a first magnetic layer having a variable magnetization direction, a second magnetic layer having a fixed magnetization direction, a nonmagnetic layer provided between the first magnetic layer and the second magnetic layer, and a resistance adjustment layer which adjusts a resistance of a respective one of the first stacked structure and the second stacked structure,
   the first magnetic layer, the second magnetic layer, the nonmagnetic layer, and the resistance adjustment layer included in each of the first stacked structure and the second stacked structure are stacked in one direction, and
   a thickness of the resistance adjustment layer included in the first stacked structure and a thickness of the resistance adjustment layer included in the second stacked structure are different from each other.

2. The magnetic memory device according to claim 1, wherein the thickness of the resistance adjustment layer included in the second stacked structure is larger than the thickness of the resistance adjustment layer included in the first stacked structure.

3. The magnetic memory device according to claim 1, wherein the thickness of the resistance adjustment layer included in the second stacked structure is smaller than the thickness of the resistance adjustment layer included in the first stacked structure.

4. The magnetic memory device according to claim 1, wherein:
the first memory cell further includes a first switching element connected to the first stacked structure, and
the second memory cell further includes a second switching element connected to the second stacked structure.

5. The magnetic memory device according to claim 1, wherein the resistance adjustment layer contains a metal oxide.

6. The magnetic memory device according to claim 5, wherein the metal oxide is a magnesium oxide or an aluminum oxide.

7. A magnetic memory device comprising:
a first memory cell which includes a first stacked structure; and
a second memory cell which is provided on the first memory cell and includes a second stacked structure, wherein:
each of the first stacked structure and the second stacked structure includes a first magnetic layer having a variable magnetization direction, a second magnetic layer having a fixed magnetization direction, and a nonmagnetic layer provided between the first magnetic layer and the second magnetic layer,
one of the first stacked structure and the second stacked structure further includes a resistance adjustment layer which adjusts a resistance of the one of the first stacked structure and the second stacked structure,
the other of the first stacked structure and the second stacked structure includes no resistance adjustment layer, and
the first magnetic layer, the second magnetic layer, the nonmagnetic layer, and the resistance adjustment layer included in the one of the first stacked structure and the second stacked structure are stacked in one direction.

8. The magnetic memory device according to claim 7, wherein the resistance adjustment layer contains a metal oxide.

9. The magnetic memory device according to claim 8, wherein the metal oxide is a magnesium oxide or an aluminum oxide.

10. The magnetic memory device according to claim 7, wherein:
the first memory cell further includes a first switching element connected to the first stacked structure, and
the second memory cell further includes a second switching element connected to the second stacked structure.

* * * * *